United States Patent
Popescu

(10) Patent No.: US 10,768,257 B2
(45) Date of Patent: Sep. 8, 2020

(54) METHOD AND APPARATUS FOR GENERATING MAGNETIC RESONANCE IMAGES

(71) Applicant: Siemens Healthcare GmbH, Erlangen (DE)

(72) Inventor: Stefan Popescu, Erlangen (DE)

(73) Assignee: Siemens Healthcare GmbH, Erlandgen (DE)

( * ) Notice: Subject to any disclaimer, the term of this patent is extended or adjusted under 35 U.S.C. 154(b) by 0 days.

(21) Appl. No.: 16/383,907

(22) Filed: Apr. 15, 2019

(65) Prior Publication Data

US 2019/0317168 A1 Oct. 17, 2019

(30) Foreign Application Priority Data

Apr. 16, 2018 (EP) .................................... 18167520

(51) Int. Cl.
| | | |
|---|---|---|
| *G01R 33/56* | (2006.01) | |
| *G01R 33/48* | (2006.01) | |
| *G01R 33/483* | (2006.01) | |
| *G01R 33/565* | (2006.01) | |

(52) U.S. Cl.
CPC ..... *G01R 33/5608* (2013.01); *G01R 33/4822* (2013.01); *G01R 33/4836* (2013.01); *G01R 33/56563* (2013.01)

(58) Field of Classification Search
CPC .......... G01R 33/5608; G01R 33/56563; G01R 33/4836; G01R 33/4822; G01R 33/54; A61B 5/055

See application file for complete search history.

(56) References Cited

U.S. PATENT DOCUMENTS

| | | | | |
|---|---|---|---|---|
| 5,382,904 | A | * | 1/1995 | Pissanetzky ....... G01R 33/3806 29/602.1 |
| 7,944,206 | B2 | | 5/2011 | Frydman et al. |
| 8,648,595 | B2 | | 2/2014 | Blumhagen et al. |

(Continued)

FOREIGN PATENT DOCUMENTS

| | | |
|---|---|---|
| DE | 102012213696 A1 | 2/2014 |
| WO | 2008065389 A1 | 6/2008 |
| WO | 2010068299 A1 | 6/2010 |

OTHER PUBLICATIONS

Fessler, J. A.: "Model-Based Image Reconstruction for MRI: A review of the use of iterative algorithms.", in IEEE Signal Processing Magazine (81-89) Jul. 2010; 2010.

(Continued)

*Primary Examiner* — G. M. A Hyder
(74) *Attorney, Agent, or Firm* — Schiff Hardin LLP

(57) ABSTRACT

In a method, control computer and magnetic resonance (MR) apparatus for generating MR recordings of an examination object, first magnetic MR data are acquired in a first recording region inside a homogeneity volume of the scanner of the MR apparatus, and second MR raw data are acquired in a second recording region outside the homogeneity volume. First image data are reconstructed on the basis of the first MR raw data and second image data are reconstructed on the basis of the second MR raw data. The first image data and the second image data are combined to form combination image data, which cover a region that extends in the first recording region and in the second recording region.

13 Claims, 9 Drawing Sheets

(56) References Cited

U.S. PATENT DOCUMENTS

| | | | |
|---|---|---|---|
| 8,710,839 B2 | 4/2014 | Constable et al. | |
| 9,791,526 B2 | 10/2017 | Barmet et al. | |
| 2006/0058628 A1* | 3/2006 | Fuderer | G01R 33/5611 600/410 |
| 2006/0244451 A1* | 11/2006 | Ni | G01R 33/3875 324/320 |
| 2008/0204020 A1 | 8/2008 | Chamberlain et al. | |
| 2012/0265050 A1 | 10/2012 | Wang | |
| 2013/0271133 A1 | 10/2013 | Snyder et al. | |
| 2014/0035577 A1 | 2/2014 | Blumhagen et al. | |
| 2015/0217136 A1* | 8/2015 | Stanescu | A61B 5/055 600/411 |

OTHER PUBLICATIONS

"ESMF Python Regridding Interface" (ESMPy) (siehe www.earthsystemcog.org/projects/esmpy/); 2018.

"Modular Aerodynamic Design Computational Analysis Process (MADCAP)" (www.grc.nasa.gov/www/winddocs/madcap/ggs.html/); 2008; and.

European Search Report dated Nov. 12, 2018, for Application No. 18167520.8.

\* cited by examiner

METHOD AND APPARATUS FOR GENERATING MAGNETIC RESONANCE IMAGES

BACKGROUND OF THE INVENTION

Field of the Invention

The invention concerns a method for generating magnetic resonance (MR) images of an examination object in an MR tomography apparatus and a control computer for controlling an MR tomography scanner of an MR tomography apparatus and a corresponding MR apparatus.

Description of the Prior Art

Two- or three-dimensional image data, or a time series of image data, can be used for the visualization of the inside of a body. Such data are generated with the use of modern imaging modalities. An examination object can be a patient or test subject, for example in the case of a whole body scan. Usually, however, it is only part of a patient, such as the chest or an organ, etc. Imaging systems that implement magnetic resonance (MR) scanning are known as magnetic resonance tomography systems and have successfully become established and proven through a wide variety of applications. A static basic magnetic field $B_0$ used for initial orientation and homogenization of magnetic dipoles (nuclear spins) to be examined, and is overlaid with a rapidly-switched magnetic field, known as the gradient field, in order to spatially resolve (spatially encode) the MR signal.

In order to determine material properties of an examination object to be imaged, the dephasing or relaxation time of the nuclear spins, after a deflection of their magnetization from the initial orientation, is determined, so different relaxation mechanisms or relaxation times that are typical of the material can be identified. The deflection usually occurs due to a number of RF pulses and the spatial resolution is based on a fixed-in-time manipulation of the deflected magnetization with the aid of the gradient field, in a procedure known as a measuring sequence or control sequence, which defines the precise temporal sequence of RF pulses, the change in the gradient field (by emission of a switching sequence of gradient pulses) and the acquisition of measured values.

Typically, there is an association between measured magnetization—from which the material properties can be derived—and a spatial coordinate of the measured magnetization in the spatial domain in which the examination object is situated, with the execution of an intermediate step. In this intermediate step, the magnetic resonance raw data that were acquired in the frequency domain are mathematically transformed and, on the basis of this transformation, the image data are reconstructed (the magnetic resonance raw data are transformed into the image domain). The frequency domain is known as "k-space". In k-space the magnetic resonance raw data are entered into a memory at readout points in k-space, wherein the coordinates of k-space are encoded as a function of the gradient fields. The magnitude of the magnetization (in particular the transverse magnetization, determined in a plane transverse to the above-described basic magnetic field) at a particular location of the examination object can be determined from k-space data with the use of a Fourier transform. In other words, k-space data (magnitude and phase) are required for calculating the signal strength of the signal, and optionally its phase, in the spatial domain.

The basic magnetic field $B_0$ of approx. 0.5 T and above, exists in the magnetic resonance scanner, is generated by a superconducting basic magnetic field magnet that has a number of concentric superconducting coils. The coils are arranged such that a homogeneous region of the basic magnetic field has a spherical form, which is known as a spherical image volume SIV.

In reality, however, the basic magnetic field $B_0$ is not homogenous or not universally homogenous but has inhomogeneities, especially at locations farther from its isocenter, in other words the center of a tunnel or curve of the magnetic resonance scanner.

For a successful scan of an examination object, it is necessary for the basic magnetic field $B_0$ to be sufficiently strong and homogeneous throughout the recording (data acquisition) volume (field of view, conventionally called FoV), in order to be able to carry out optimally exact measurements.

Due to physical and technical conditions, such as the limited magnetic field homogeneity and the non-linearity of the gradient field, the measuring volume or recoding volume is therefore limited in all three spatial directions. The field of view is thereby limited to a volume in which the above-mentioned physical features exist within a predefined tolerance range. For example, there may be a requirement that the homogeneity of the static magnetic field $B_0$ has a smaller deviation than 20 ppm peak-to-peak or less than 3 ppm Root Mean Square (RMS). Therefore, sufficiently exact imaging of the object to be examined is possible with conventional measuring sequences only in such FoV. Therefore, the field of view normally constitutes a maximum of the spherical image volume SIV.

To achieve a larger homogeneity region, and therefore to increase the field of view, the number of superconducting coils can be increased. However, this results in increased cost and an increased overall size of the magnetic resonance scanner.

Moreover, wide bore (wide tunnel) magnetic scanners having a cylindrical tunnel diameter of 70 cm have been introduced. These magnetic resonance scanners combine outstanding patient access and comfort of a more open bore tunnel with high-quality imaging of a conventionally closed bore tunnel. On the basis of this combination, the wide bore magnetic resonance scanners have become standard in many hospitals. Nonetheless, the size of the image volumes or the field of view has not improved with such wide bore magnetic resonance scanners. The diameter DSV of the spherical image volume SIV remains at only 55 cm even with a magnetic resonance scanner having a 70 cm tunnel opening. However, this diameter is also already customary for the conventional magnetic resonance scanners having a tunnel opening of just 60 cm. The field of view is considerably smaller, especially in the x and y directions, in other words perpendicular to the longitudinal axis of the cylindrical tunnel of the magnetic resonance scanner, than the volume that is limited by the tunnel of the magnetic resonance scanner.

It is therefore proposed in U.S. Pat. No. 8,648,595 to record an MR image in a particular slice position in which the static magnetic field at the edge of the MR image satisfies a predefined homogeneity criterion. There are a few transverse slices here, which are situated at particular slice positions along the z-axis, which have a diameter of an associated homogeneous slice that could be significantly larger than a diameter that would be expected by execution of a conventional reconstruction in the spherical image volume SIV.

This method does not expand the size of the spherical imaging volume SIV, however, and instead simply uses an imaging volume model, which has a very complex external contour, instead of the spherical volume model. One drawback of this method is, that in the case of complementary and convoluted slice positions along the z-axis, the imaging volume is still limited by the diameter DSV of the spherical image volume SIV.

SUMMARY OF THE INVENTION

An object of the present invention is to provide a method for generating magnetic resonance images and a suitable control computer for carrying out the method, with which the field of view of a magnetic resonance scanner can be inexpensively expanded.

The inventive method for generating magnetic resonance images of an examination object in the scanner of a magnetic resonance apparatus includes the following steps.

First, first magnetic resonance raw data are acquired in a first recording region inside a homogeneity volume of a basic magnetic field of the magnetic resonance scanner.

In addition, second magnetic resonance data are acquired in a second recording region outside the homogeneity volume of the magnetic resonance scanner.

The first and second recording regions are spatial regions in which the regions depicted by the subsequently reconstructed image data are located, regardless of whether these depicted regions are a three-dimensional volume or a slice.

The first magnetic resonance raw data and the second magnetic resonance data can be acquired simultaneously, or successively.

First image data are generated on the basis of the first magnetic resonance raw data and second image data is reconstructed on the basis of the second magnetic resonance raw data. The image points of the image data can be pixels or voxels depending on whether slice image data or volume image data were reconstructed.

The sequence as to when particular image data are reconstructed can initially be arbitrary. For example, if the first magnetic resonance raw data were recorded before the second magnetic resonance raw data, then the first image data can be reconstructed while the second magnetic resonance raw data are being acquired. The second magnetic resonance raw data can also be acquired before the first magnetic resonance raw data, and then the second image data are firstly reconstructed. Simultaneous reconstruction of the first image data and second image data is also possible.

The first image data and the second image data are inventively combined to form combination image data, which cover a region that extends in the first recording region and the second recording region. The combination image data can correspond to continuous sectional images or volumes with an expanded field of view, which extend far beyond the homogeneity volume.

In the simplest case, this expansion of the field of view is enabled by a software adjustment or readjustment. Therefore, no increased technical additional expenditure is required, as would occur by introducing additional superconducting coils. No extreme cost increases occur for the production of a magnetic resonance tomography apparatus in order to enlarge the field of view thereof.

A corresponding inventive control computer for controlling a magnetic resonance scanner of a magnetic resonance tomography apparatus, is configured to implement the inventive method described above.

An acquisition control processor operates the scanner in order to acquire first magnetic resonance raw data in a first recording region inside a homogeneity volume of the scanner and to acquire second magnetic resonance raw data in a second recording region outside the homogeneity volume of the scanner.

An image reconstruction processor reconstructs first image data on the basis of the first magnetic resonance raw data and reconstructs second image data on the basis of the second magnetic resonance raw data.

A combination processor combines the first image data and the second image data so as to form combination image data, as described above, which cover a region that extends in the first recording region and the second recording region.

In order to give an existing magnetic resonance tomography scanner an expanded field of view (within the meaning of the preceding description), the magnetic resonance scanner can be supplemented by the above-described inventive control computer or the control device can be retrofitted as described below. The scanner of a magnetic resonance tomography, however, can be designed with an inventive control computer directly during manufacture thereof in order to thus achieve an expanded field of view.

The majority of the above-mentioned components of the control computer, in particular the acquisition control processor, the image reconstruction processor and the combination processor, can be wholly or partially implemented in the form of software modules. An implementation largely in terms of software has the advantage that existing control computers can be easily retrofitted by a software update in order to operate inventively.

The present invention also encompasses a non-transitory, computer-readable data storage medium encoded with programming instructions that, when the storage medium is loaded into a control computer or computer system of an magnetic resonance apparatus, cause the control computer or computer system to operate the magnetic resonance apparatus so as to implement any or all embodiments of the method according to the invention, as described above.

The computer code can optionally include additional components, such as documentation and/or peripheral components, as well as hardware components, such as hardware keys (dongles, etc.) for utilization of the program code.

The first magnetic resonance raw data acquired inside a homogeneity volume are acquired in k-space in order to reconstruct the first image data by a Fourier Transform or a Fast Fourier Transform (FFT). This is a fast reconstruction method for which almost all existing magnetic resonance apparatuses are designed already.

The field inhomogeneities in the second recording region outside the homogeneity volume of the magnetic resonance scanner, in which the second magnetic resonance raw data are acquired, are usually not subject to Fourier physical effects, however. This means that the signal-encoding function, which is used here, is not in the form of a conventional Fourier integral of a magnetic resonance tomography apparatus. Therefore, the acquired magnetic resonance raw data cannot be acquired or arranged in k-space, as is usually conventional in the prior art. Consequently, the image reconstruction cannot be achieved by a direct k-space inversion, as is achieved with Cartesian magnetic resonance tomography having linear gradients and homogeneous magnetic fields. For this reason, the second image data are reconstructed on the basis of the second magnetic resonance raw data by a signal model-based image reconstruction method. Here, a signal model is generated that restores the expected amplitudes and phases of measured echo signals as a function of the encoding pattern. (See, for example, Fessler "Model Based Image Reconstructions for MRI," IEEE signal Processing Magazine [81] July (2010) in this regard.)

The image points (in other words, pixels or voxels) of the first image data, which are based on the first magnetic resonance raw data and that have been acquired inside a homogeneity volume, usually have an isotropic form. The image points of the second image data usually have an anisotropic form, however. This is due to the fact that the second image data were acquired on the basis of the second magnetic resonance raw data outside the homogeneity volume or in the inhomogeneity volume. The magnetic field is distorted in the inhomogeneity volume. This is because the magnetic field does not have the same value in every direction (in the x, y, z directions) over the same section. The image points of the second image data, therefore, sometimes have different contributions for defined spatial encoding frequency values and spatial encoding phases.

When the first image data and second image data are now combined to form combination image data, then the first image data are preferably reconstructed in one step so as to be depicted on a first isotropic grid, for example with the Fourier Transform already mentioned, preferably with an FFT.

By contrast, the image points of the second image data, due to their anisotropic form following reconstruction, are preferably depicted by a regridding method (in which interpolation occurs from one grid resolution to a different grid resolution) on an isotropic grid that is adapted to the first isotropic grid. This ensures that the isotropic grid, on which the image points of the second image data are depicted, has an identical grid spacing or an identical grid size to the first isotropic grid, as well as an adjusted position of the image points while forming an expansion of the first isotropic grid toward the outside periphery.

Various tools and methods are known to those skilled in the art in order to basically transform image points from an anisotropic grid with different horizontal and vertical resolutions into a projected and isotropic grid. Examples of this are software or software libraries that are provided within the framework of the projects: "ESMF Python Regridding Interface" (ESMPy) (see www.earthsystemcog.org/projects/esmpy/) or "Modular Aerodynamic Design Computational Analysis Process (MADCAP)" (www.grc.nasa.gov/www/winddocs/madcap/ggs.html/) for the field of climate, weather and wind data whose mathematical methods can be used here.

The first magnetic resonance raw data are inventively acquired inside the homogeneity volume. The second magnetic resonance data, by contrast, are acquired outside the homogeneity volume, and thus in an inhomogeneity volume or inhomogeneity region. They are acquired in a 2D magnetic resonance tomography (MR) sequence, preferably on what are known as iso-frequency contours which approximately correspond to wave-like or star-shaped rings. In a 3D magnetic resonance tomography (MR) sequence the magnetic resonance raw data are preferably recorded on iso-frequency surfaces, which preferably constitute approximate wave-like surfaces, of a relatively constant basic magnetic field of the magnetic resonance tomography scanner. The iso-frequency contours and iso-frequency surfaces constitute contours or surfaces having a constant basic magnetic field deviation. Therefore, the resonance frequency is also identical along an iso-frequency contour or along an iso-frequency surface.

A 2D-MR sequence and a 3D-MR sequence describe measuring sequences which define an accurate temporal sequence of RF pulses, the change in the gradient field and the acquisition of measured values.

If the first magnetic resonance raw data are acquired by a 2D-MR sequence, then the magnetic resonance raw data comprises slice raw data. The same applies to the second magnetic resonance raw data. If the second raw data are acquired by 2D-MR sequence, then the second magnetic resonance raw data are similarly slice raw data.

If the first magnetic resonance raw data, by contrast, are acquired by means of a 3D-MR sequence, then the magnetic resonance raw data are volume raw data. The same applies to the second magnetic resonance raw data as well. If the second raw data are acquired by a 3D-MR sequence, the second magnetic resonance raw data are volume raw data.

It is not necessary for the first magnetic resonance raw data and the second magnetic resonance raw data to be acquired with the same MR sequence. Therefore, for example, the first magnetic resonance raw data can be acquired during a 2D-MR sequence and the second magnetic resonance raw data during a 3D-MR sequence, or vice versa.

In addition, the acquired slice raw data can be combined during a reconstruction to form an image volume and therefore reproduce a 3D view of the inside of an examination object.

Various methods can be applied in order to acquire the first and second magnetic resonance raw data. For example, an MR spin echo signal is preferably used for the acquisition of the magnetic resonance raw data.

Likewise preferably, and therefore described in the below, an MR gradient echo signal is generated, but for the acquisition at the echo time TE, with a frequency-encoding pulse. The frequency-encoding pulse can be the Gx, Gy or Gz gradient, or a combination thereof.

For acquisition or recording of the second magnetic resonance raw data, during a 2D-MR sequence, preferably a slice-selective RF excitation pulse with a limited bandwidth are used, due to which only a limited number of slices is excited. Due to the limited bandwidth of the RF excitation pulse, first a slice width, for example along the z-axis, is controlled and second, the extent of pixels along a selected frequency contour. The RF excitation pulse preferably has a mean frequency that corresponds to a mean magnetic field value along a selected frequency contour, for example in resonance to a mean frequency with a $B_0$ magnetic field deviation+10 ppm and with a bandwidth of, for example, ±2 ppm around the $B_0$ magnetic field deviation+10 ppm.

A bipolar slice gradient pulse, in other words a slice-selective gradient pulse, is preferably then activated so as to be consistent, in other words correlated time-wise, with the slice-selective RF excitation pulse. The slice gradient pulse is preferably the Gz gradient in order to thus likewise control the slice position, for example along the Z-axis. Due to the bipolarity of the slice gradient pulse, all excited spins incur an identical phase, in other words there is a refocusing of the excited spins. The readout then occurs in a readout window.

As mentioned, a 3D-MR sequence can also be used to acquire volume raw data. In the case of a 3D-MR sequence for the acquisition of the second magnetic resonance raw data in the second recording region, a non-slice-selective RF excitation pulse is preferably played out, wherein an irradiation of the RF excitation pulse with a limited bandwidth also occurs, but without slice gradient pulse. Here too, the RF excitation pulse with limited bandwidth preferably has a mean frequency which corresponds to a mean magnetic field value on a selected frequency surface.

A phase-encoding pulse is preferably subsequently activated so as to be consistent with the non-selective RF excitation pulse. The phase-encoding pulse arrives appropriately correlated time-wise with a frequency-encoding pulse. The phase-encoding pulse can be the Gx, Gy or Gz gradient or also a combination thereof. The readout then occurs in a readout window.

With a 3D-MR sequence, in principle a slice-selective RF excitation pulse could also be used, however. For example, a relatively thick slice of, for example, 15 cm is recorded in this case. This slice in turn contains relatively thin slices of, for example, 1 mm, which have a spacing of, for example, 3 mm from each other. This resultant "slice ridge" is shifted until an entire recording region is covered. In the inhomogeneity region the slices are shifted only along the iso-frequency surfaces, however. The resultant slices are also described as "simultaneous multislices".

The above-described 2D-MR sequences or 3D-MR sequences can be periodically repeated with a repetition time TR (repetition time TR=time until successive pulse sequences are applied to the same slice) for the various possible orthogonal combinations of phase and frequency-encoding gradients. In addition, the above-described MR sequences are iteratively repeated with the repetition time TR for different iso-frequency contours, or corresponding iso-frequency surfaces, until a "target field of view" or a target value is achieved for a field of view.

For the reconstruction of the image data, as well as for the optimum adjustment of parameters for the different MR sequences, it is helpful to identify the inhomogeneous field distribution in advance and also the non-linearity of the gradient outside the homogeneity volume. For this purpose a magnetic field distribution is determined at least in the second recording region outside the homogeneity volume at least before acquisition of the second magnetic resonance raw data, preferably before emission of the RF excitation pulse. The magnetic field are preferably also distributed before activating the slice gradient pulse, or else before activating the phase-encoding pulse. The magnetic field distribution can be measured, calculated or else simulated for this purpose, for example during a pre-calibration. For example, a type of map of the magnetic field distribution can be generated on scanning a patient (in other words, the acquisition of the magnetic resonance raw data), which can be read, for example, from the calibration data.

Suitable dynamic magnetic field cameras, for example, can be used for measuring the magnetic field distribution. Temperature sensors can also be used, however, in order to take account, for example, of magnetic field shifts due to thermal effects. For example, a plurality of calibration datasets could be measured and stored for this for a particular span of operating temperatures of the magnetic resonance tomography system.

DESCRIPTION OF THE PREFERRED EMBODIMENTS

Figure 1:
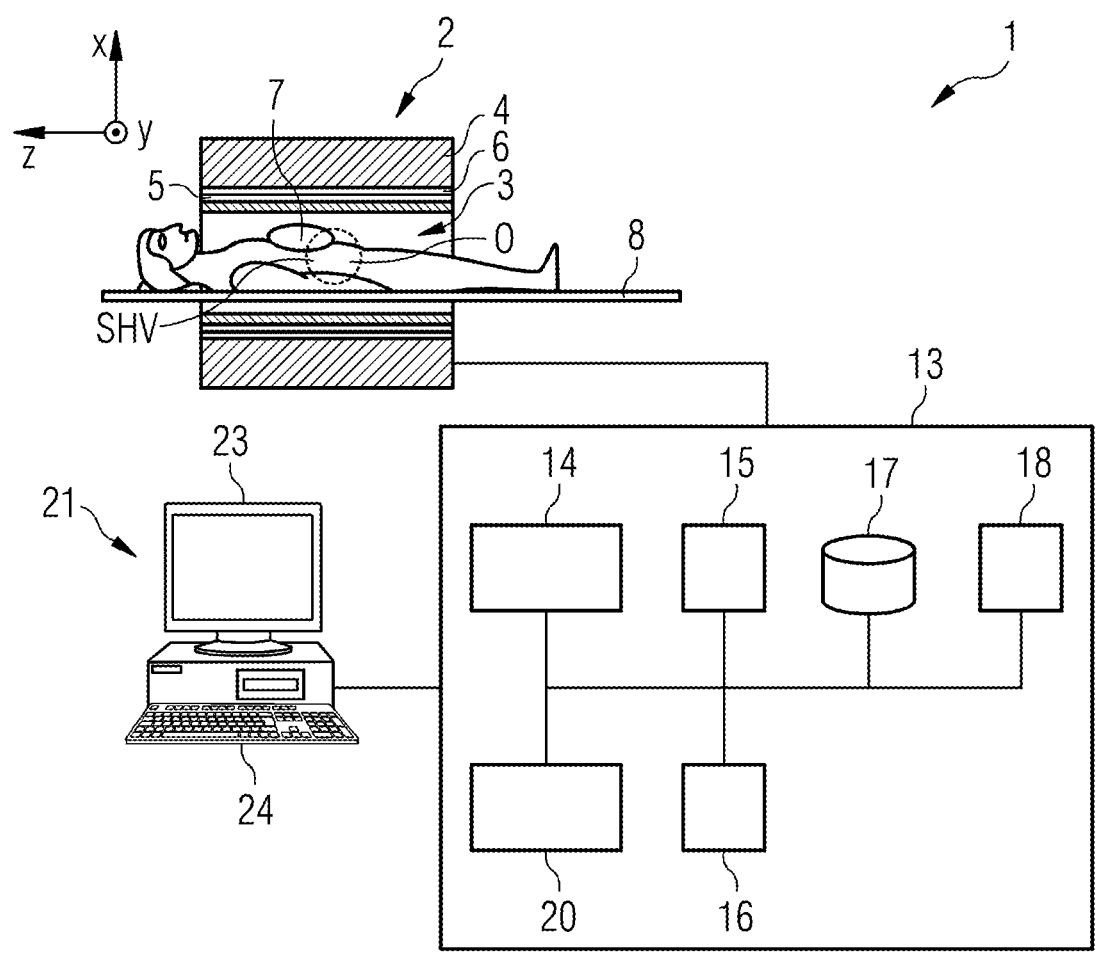
FIG. 1 schematically illustrates a magnetic resonance tomography system according to one exemplary embodiment of the invention.

FIG. 1 schematically illustrates a magnetic resonance tomography apparatus 1. It includes the actual magnetic resonance tomography scanner 2 having an examination space 3 or patient tunnel. The whole body of a patient or test subject constitutes the actual examination object O, or a particular body region constitutes the examination object O. The patient or test subject is moved through the examination space 3 on a bed 8.

The magnetic resonance scanner 2 is conventionally fitted with a basic field magnet 4, a gradient system 6, and an RF transmit antenna system 5, and an RF receive antenna system 7. In the illustrated exemplary embodiment, the RF transmit antenna system 5 is a body coil permanently installed in the magnetic resonance scanner 2. The RF receive antenna system 7 includes local coils for arrangement on the patient or test subject (symbolized only by a single local coil in FIG. 5). Basically, however, the body coil can also be used as an RF receive antenna system and the local coils as an RF transmit antenna system provided these coils can each be switched over into different operating modes. The gradient system 6 conventionally has individually controllable gradient coils in order to be able to switch independently of each other in the x, y or z direction. In addition, the magnetic resonance scanner 2 contains shim coils (not shown) that are conventionally designed.

The basic field magnet 4 includes multiple magnetic coils and is conventionally designed so as to generate a basic magnetic field $B_0$ in the longitudinal direction of the patient, in other words along the longitudinal axis of the magnetic resonance scanner 2 running in the z direction. A homogeneity region of the basic magnetic field $B_0$ in which the basic magnetic field $B_0$ is homogeneous is present tin the scanner 2. The homogeneity region corresponds here to a spherical homogeneity volume SHV, which is shown in dashed lines and is located inside the patient tunnel 3. The iso-center of the magnetic resonance scanner 2 is located in the homogeneity volume SHV.

The magnetic resonance tomography apparatus 1 also has a central control computer 13 that controls the entire magnetic resonance tomography apparatus 1. The central control computer 13 has an acquisition controller or image recording processor 14 for pulse sequence control. The sequences of RF pulses and gradient pulses are controlled in this processor as a function of a selected imaging sequence. For emitting the individual RF pulses, the central control computer 13 has an RF controller 15 and for controlling the gradient pulses, a gradient controller 16, which communicate accordingly with the image recording processor 14 in order to emit the pulse sequences. The RF controller 15 includes not only a transmit unit, in order to emit the RF pulse sequences, but also a reception unit in order to acquire magnetic resonance raw data in a coordinated manner.

A reconstruction processor 20 accepts the acquired raw data and reconstructs the image data therefrom. The image data can then be stored, for example, in a memory 17.

The acquisition of raw data radiation of RF pulses and the generation of gradient fields, and the reconstruction of MR images therefrom are basically known to those skilled in the art, and thus need not be explained in more detail herein.

The reconstructed image data can then be combined—as will be explained below—in a combination processor 18, so as to form combination image data BDK to obtain a final homogeneous MR image.

The central control computer 13 can be controlled via a terminal interface 21 by the use of an input unit 24 and a display unit 23, with which the entire magnetic resonance tomography apparatus 1 can be operated by an operator. MR images can be displayed on the display unit 23, and measurements can be planned and started by using the input unit 24, optionally in combination with the display unit 23.

Figure 2:
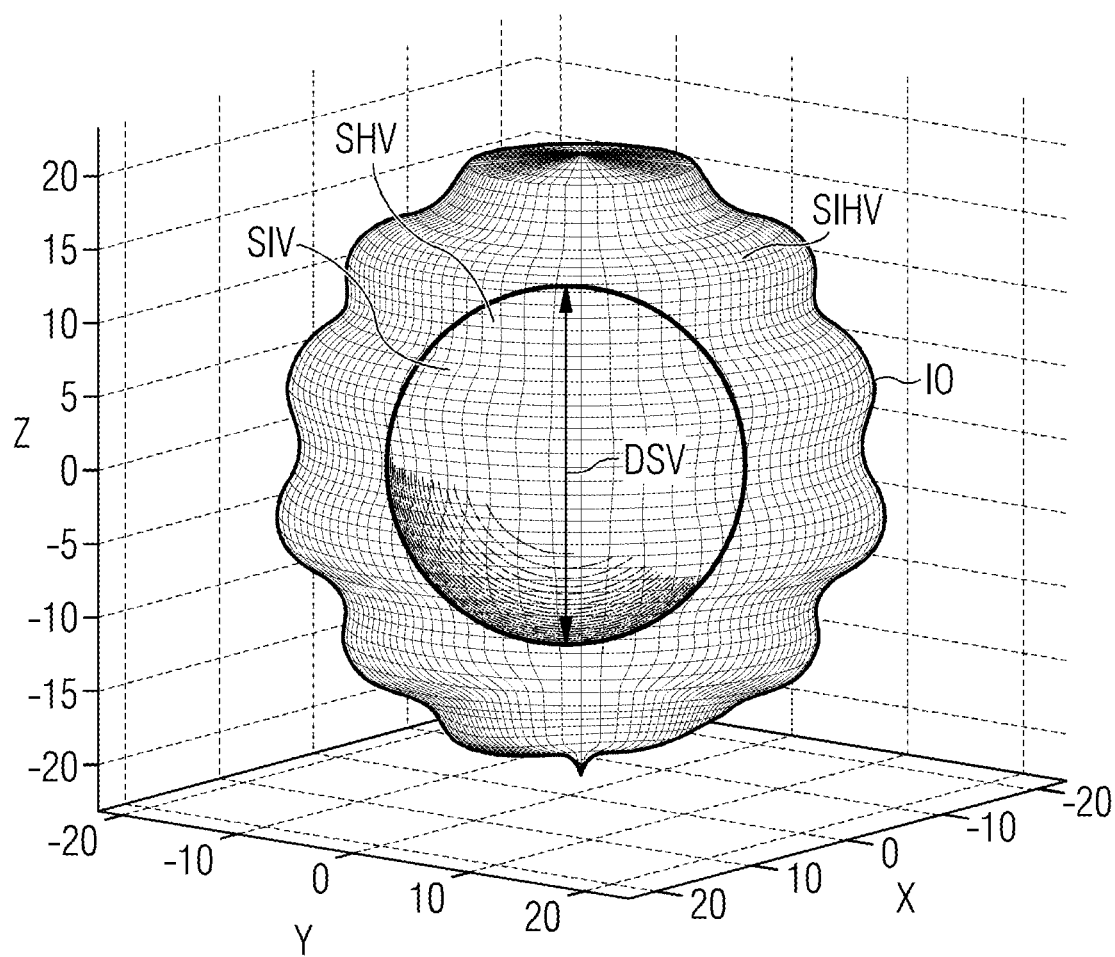
FIG. 2 is a schematic diagram of the spherical image volume SIV of the static $B_0$ magnetic field ($B_0$ homogeneity volume SHV) and a $B_0$ inhomogeneity volume SIHV outside the spherical image volume SIV of a magnetic resonance tomography apparatus.

FIG. 2 shows an example of a magnetic field distribution with the homogeneity volume SHV from FIG. 1. In this homogeneity volume SHV a variation in the prevailing basic magnetic field $B_0$ is less than 20 ppm peak-to-peak or less than 3 ppm RMS. Previously, the acquisition of magnetic resonance raw data RD1, RD2 has been limited to this measurement volume, the spherical image volume SIV with a diameter DSV, which contains the above-mentioned tolerance indication. This means that a field of view matches the spherical image volume SIV.

Outside of the homogeneity volume SHV there is an inhomogeneity volume SIHV. The surface or the iso-frequency surface of the magnetic field deviation is very pronounced here and undulates or meanders in a complex manner, with the homogeneity of the static magnetic field $B_0$ having a greater deviation than, for example, 20 ppm peak-to-peak or greater than 3 ppm RMS.

Figure 3:
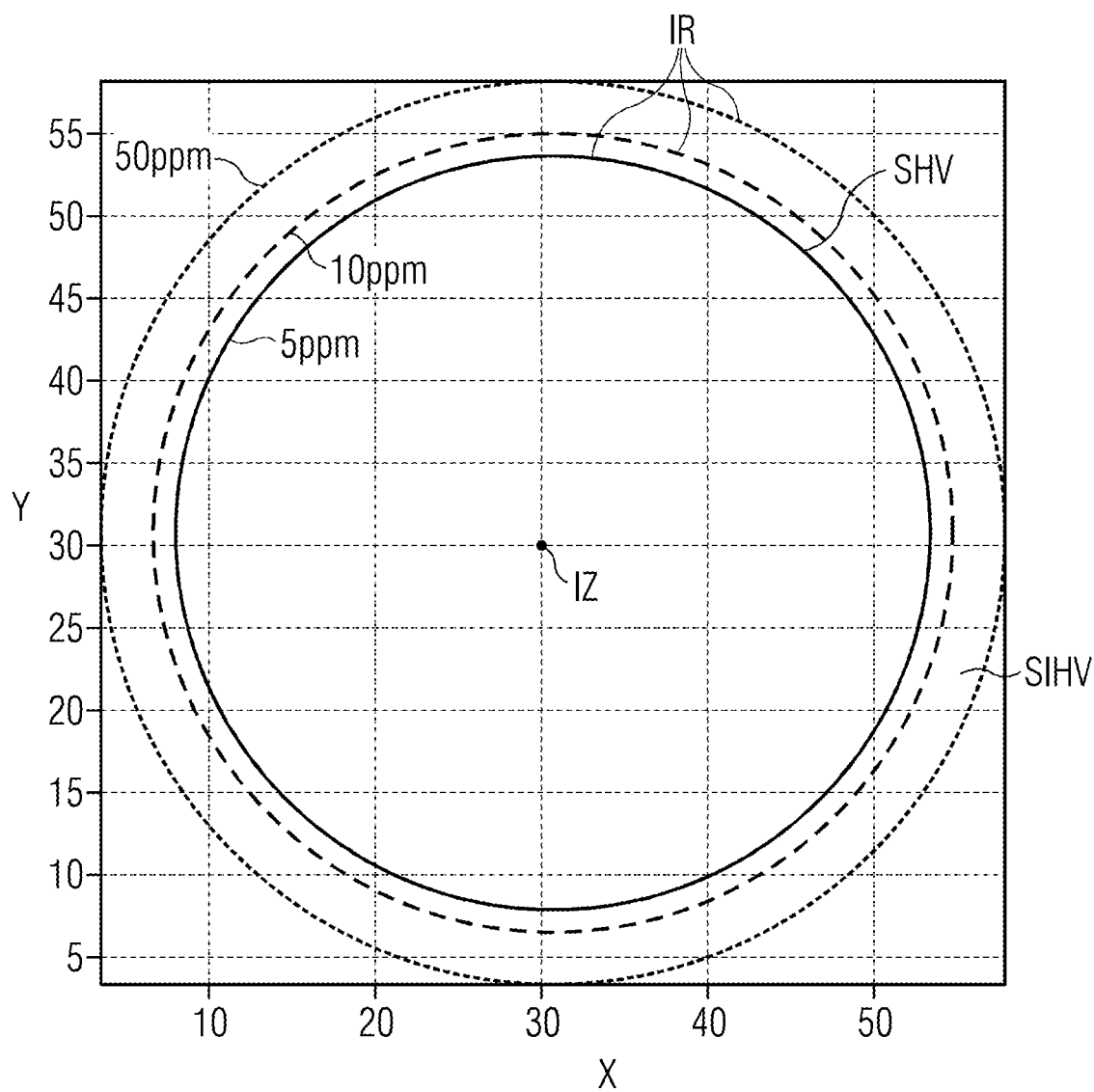
FIG. 3 is a section through the $B_0$ homogeneity volume SHV and the $B_0$ inhomogeneity volume SIHV of FIG. 2 in a transverse slice plane.
Figure 4:
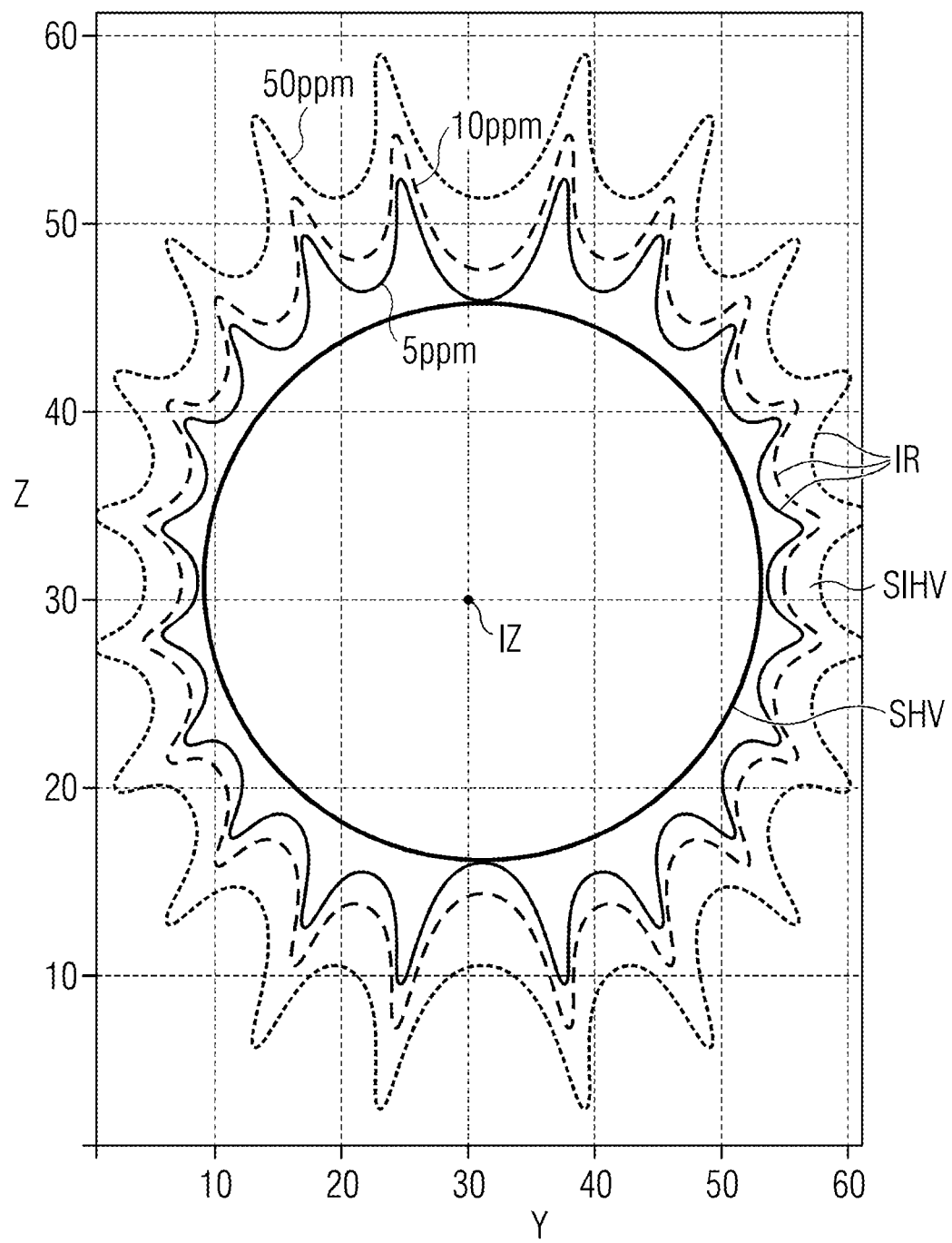
FIG. 4 is a section through the $B_0$ homogeneity volume SHV and the $B_0$ inhomogeneity volume SIHV of FIG. 2 in a sagittal slice plane.
Figure 5:
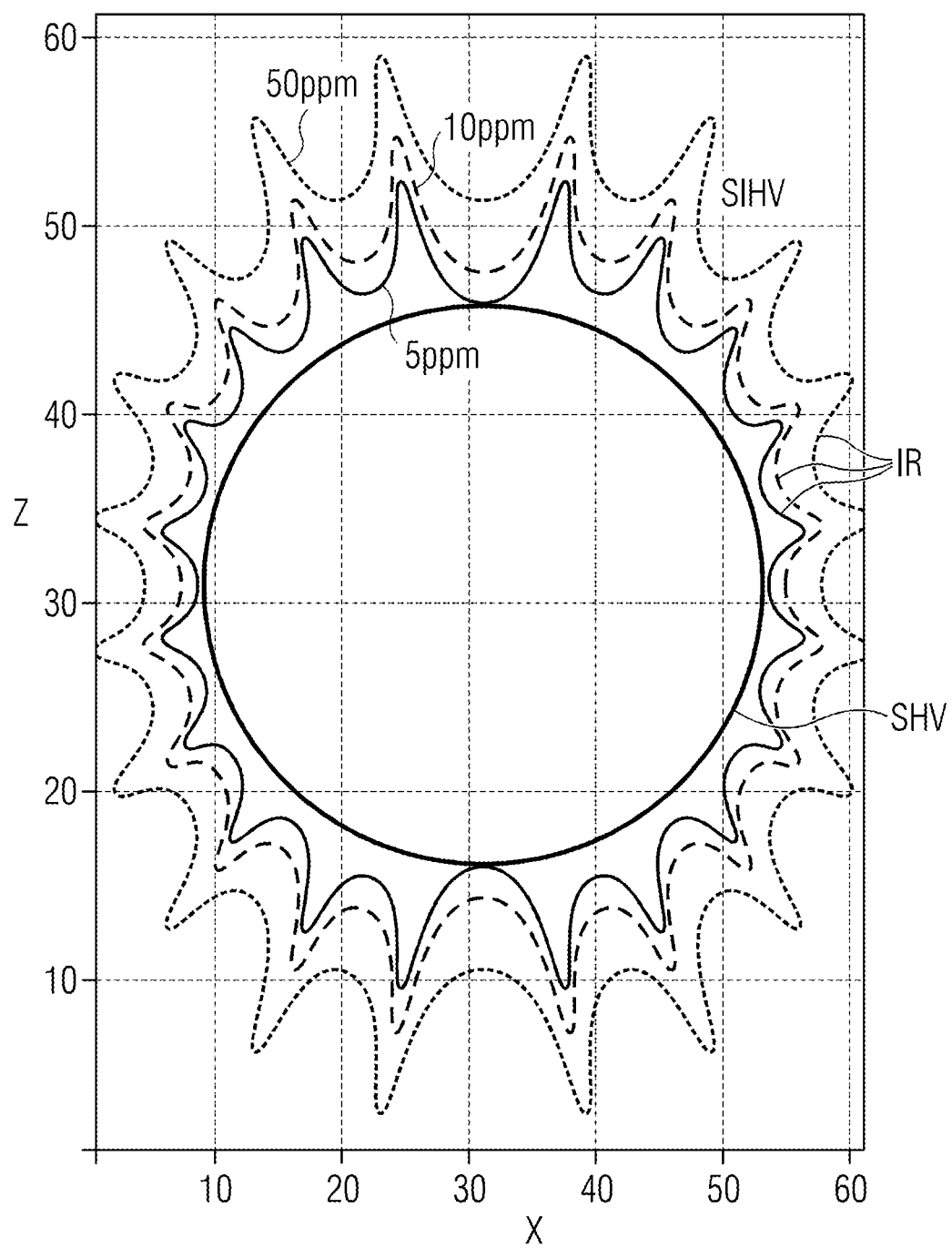
FIG. 5 is a section through the $B_0$ homogeneity volume SHV and the $B_0$ inhomogeneity volume SIHV of FIG. 2 in a coronal slice plane.

FIGS. 3 to 5 show different sections through the magnetic field distribution in FIG. 1. FIG. 3 shows the magnetic field deviation in a transverse slice, in other words in the x-y plane perpendicular to the z-axis (see FIG. 1), FIG. 4 shows the magnetic field deviation in a sagittal slice, in other words in the y-z plane perpendicular to the x-axis, and FIG. 5 shows a magnetic field deviation in a coronal slice, in other words in the x-z plane perpendicular to the y-axis.

The transverse section through the basic magnetic field $B_0$ shown in FIG. 3 shows three lines IR which represent the three Iso-frequency contours IR on which the magnetic field deviation run, constantly in each case. FIG. 3 shows the iso-frequency contours IR for a deviation around 5 ppm, around 10 ppm and around 50 ppm. As can be seen in FIG. 3, the deviation of the magnetic field $B_0$ increases significantly as the distance from the iso-center IZ increases, in other words the closer it extends to an edge region of the ring tunnel.

As can be seen from the iso-frequency contours IR, likewise shown in FIGS. 4 and 5, for the deviations around 5 ppm, around 10 ppm and around 50 ppm, the magnetic field strength of the magnetic Felds $B_0$ periodically spatially increases and decreases at the edge of the field of view of the magnetic resonance scanner 2 in the other planes or sections. The reason for this is the conventional arrangement of the magnetic field coils for the basic magnetic field $B_0$ in the magnetic resonance scanner 2. In the case shown in FIGS. 4 and 5 five magnetic field coils lead to corresponding magnetic field increases (in the coronal representation on the left/right side respectively) close to these coils, and to corresponding magnetic field reductions between the magnetic field coils. This results in the illustrated periodic magnetic field behavior.

Figure 6:
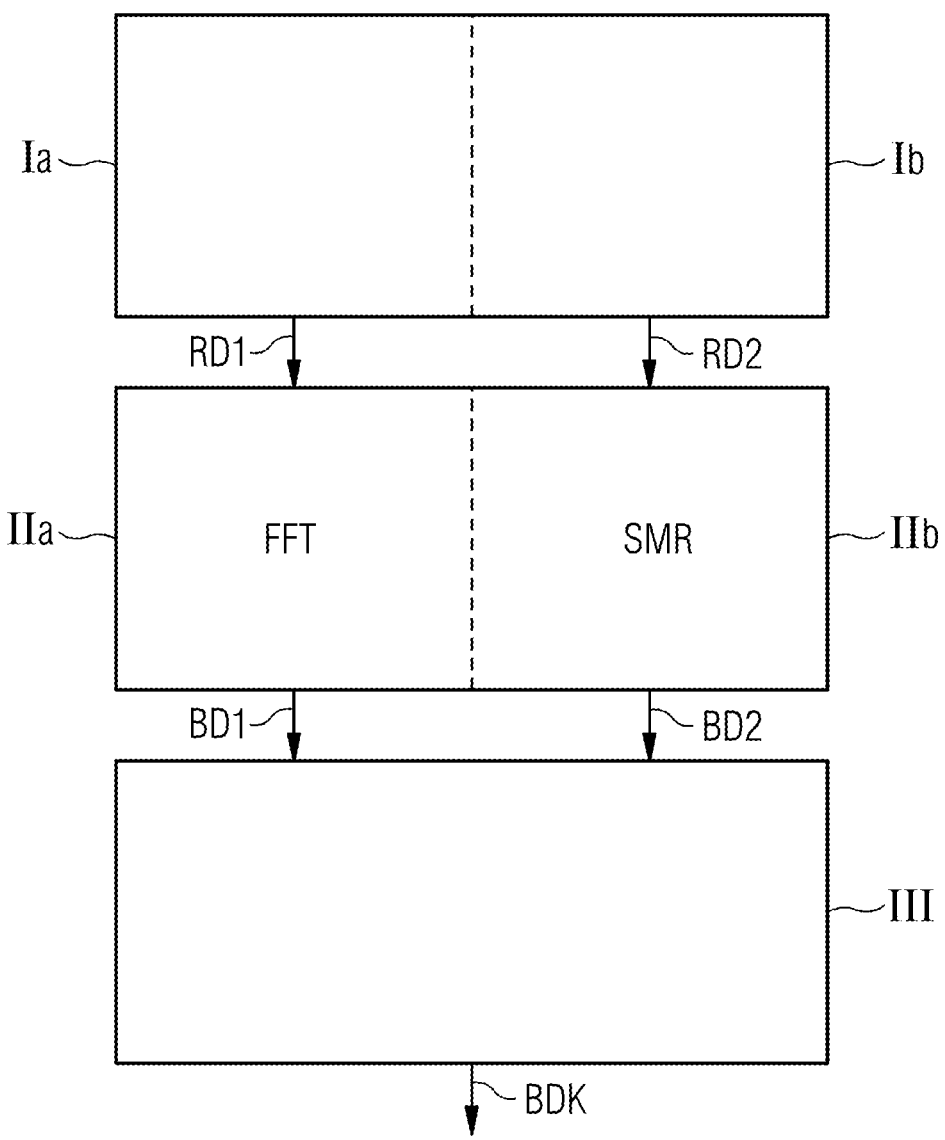
FIG. 6 is a block diagram for an embodiment of a sequence of the inventive method.

FIG. 6 is a flowchart of an embodiment of the method according to the invention.

In a first method step Ia first magnetic resonance raw data RD1 is acquired in a first recording region $B1_{2D}$, $B1_{3D}$ inside a homogeneity volume SHV.

At the same time or at different times (before or after) to the acquisition of the first magnetic resonance raw data RD1, second magnetic resonance raw data RD2 can be acquired in a method step Ib in a second recording region $B2_{2D}$, $B2_{3D}$ outside the homogeneity volume SHV.

Figure 7:
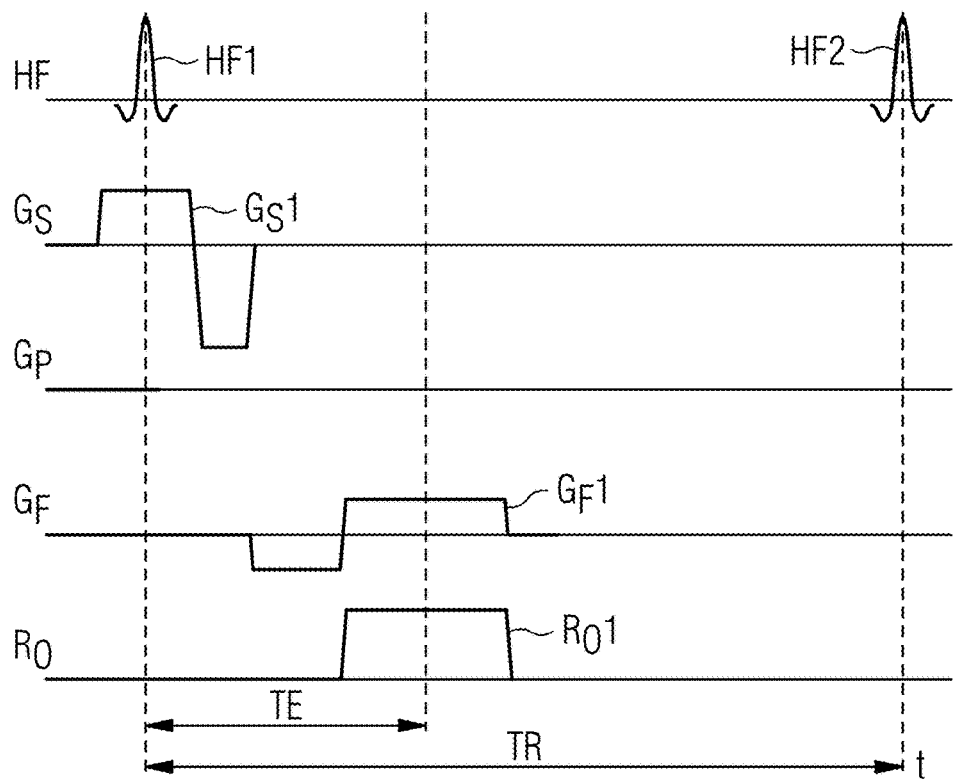
FIG. 7 is an exemplary pulse sequence that can be used for carrying out the inventive method.

For the acquisition of the magnetic resonance raw data in a second recording region $B2_{2D}$ FIG. 7 shows a pulse graph, in other words the course over time of a pulse sequence, for a 2D-MR sequence according to an exemplary embodiment of the invention. A first RF excitation pulse HF1 and a second RF excitation pulse HF2 are shown in the first row RF. The second row $G_S$ shows a bipolar slice gradient pulse $G_S1$, in other words a slice-selective gradient pulse. The frequency offsets of the RF excitation pulse HF1, together with the amplitude of the bipolar slice gradient pulse $G_S1$, determine the position and or the width of the excited slices. The frequency offsets determine an excited iso-frequency contour IR. The slice gradient pulse $G_S1$ determines the excited slices along this iso-frequency contour IR, or iso contour IR. Due to the bipolarity of the slice gradient pulse $G_S1$ there is a refocusing of the applied spins. In the fourth row $G_F$ a frequency-encoding gradient $G_F1$ is activated after the bipolar slice gradient pulse $G_S1$. With the likewise bipolar frequency-encoding gradient $G_F1$, the momentum is equalized at instant TE or set to 0. The fifth row $R_O$ shows a readout window $R_O1$. The readout or receipt of the magnetic resonance signals (the actual acquisition of the raw data) occurs temporally symmetrically around this 0-line of the momentum since then all spins are encompassed. After the repetition time TR an RF excitation pulse HF2 can then be radiated again in order to repeat the sequence iteratively. A phase-encoding gradient is not necessary here since a number of parallel receive coils are used.

With the aid of the frequency-encoding gradient $G_F1$ k-space is scanned for the slices selected with the bipolar slice gradient pulse $G_S1$. The separation of the acquired raw data or reconstructed image data of the different slices is then carried out in an evaluation step on the basis of the spatial sensibility profiles of the receive coils, for example with the known Grappa method or the SENSE method.

The first magnetic resonance raw data RD1 and the second magnetic resonance raw data RD2 can be acquired by a 3D-MR sequence as well, however.

Figure 8:
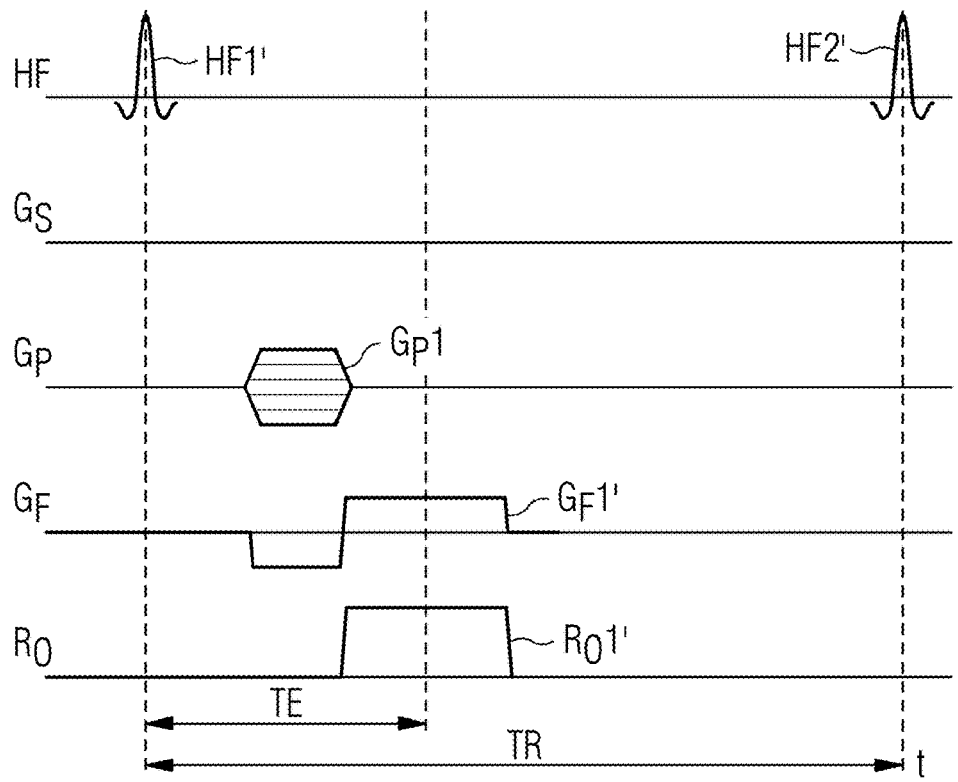
FIG. 8 is a further exemplary pulse sequence that can be used for carrying out the inventive method.

FIG. 8 shows in this regard, analogously to FIG. 7, a pulse graph for a 3D-MR sequence in a second recording region $B2_{3D}$. The first row RF shows an RF excitation pulse HF1' which is played out during an excitation phase. The RF excitation pulse HF1' also has a limited bandwidth here. The RF excitation pulse or frequency offsets therefore determine the iso-frequency surfaces and, by way of the limited bandwidth, also the thickness of the excited iso-frequency surface IO. A slice gradient pulse is not necessary here. The third row $G_P$ shows a phase-encoding gradient $G_P1$. This can be the Gx, Gy or Gz gradient or a combination of these gradients. The fourth row $G_F$ shows a frequency-encoding pulse $G_F1'$ which is used to generate an MR gradient echo signal at time TE. The frequency-encoding gradient $G_F1'$ can be the Gx, Gy, Gz gradient or a combination of these gradients. Here too a readout window $R_O1'$, shown in the fifth row $R_O$, again around the 0-line of the momentum since then, as already mentioned, all spins are in phase.

In further method steps IIa, IIb (see FIG. 6 again) the image data is then reconstructed on the basis of the acquired magnetic resonance raw data.

The reconstruction method differs here, however, for image data that are to be reconstructed on the basis of magnetic resonance raw data that were acquired inside a homogeneity volume SHV, and for image data that are to be reconstructed on the basis of magnetic resonance raw data that were acquired inside an inhomogeneity volume SIHV.

If the first magnetic resonance raw data RD1 were acquired in the homogeneity volume SHV, then—as customary—the data are acquired in (entered into) k-space. Therefore, the first image data BD1 can be reconstructed on the basis of the first magnetic resonance raw data RD1, here in the method step IIa, by execution of a Fast Fourier Transform FFT.

The second magnetic resonance raw data RD2, which were acquired in the inhomogeneity volume SIHV, are not stored in (entered into) k-space and thus are not acquired in k-space. In a method step IIb, the second image data BD2 are therefore reconstructed by execution of a signal model-based image reconstruction method SMR that proceeds on the basis of the second magnetic resonance raw data RD2. In this case a signal model is generated which returns the expected amplitudes and phases of measured echo signals as a function of the encoding scheme.

Figure 9:
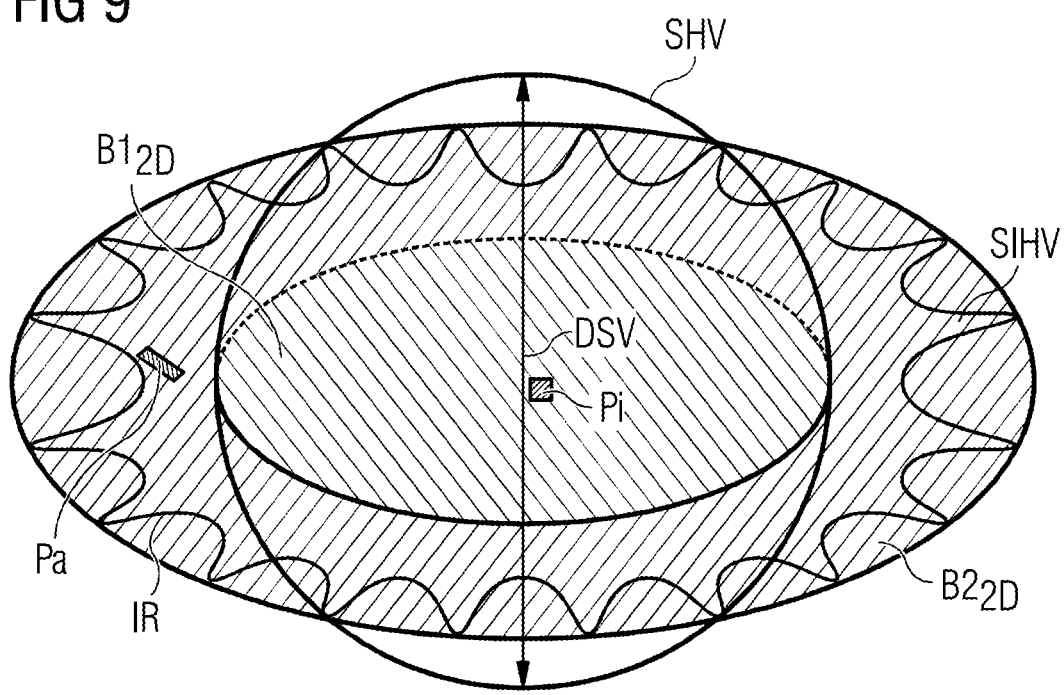
FIG. 9 is a schematic diagram of a slice that can be acquired with the inventive method for generating slice image data, the slice extending continuously inside a homogeneity volume and outside a homogeneity volume of the $B_0$ magnetic field.

FIG. 9 shows an example in this regard of image points that have been reconstructed as slice image data. A first recording region $B1_{2D}$, in which image data reconstructed inside the homogeneity volume SHV are located, and a second recording region $B2_{2D}$, in which image data reconstructed outside the homogeneity volume SHV are located, are shown. If the reconstructed image data are located inside the homogeneity volume SHV, they are isotropic pixels Pi. The reconstructed image data in the second recording region $B2_{2D}$ outside the homogeneity volume SHV are anisotropic pixels Pa, however. This is because the magnetic field $B_0$ in the inhomogeneous region or inhomogeneity region is distorted. The magnetic field $B_0$ has different values in different directions (x, y and z directions). In the second recording region $B2_{2D}$, outside the homogeneity volume SHV, the anisotropic pixels Pa therefore cannot, as already explained, be stored in k-space and be reconstructed with a Fast Fourier Transform FFT.

Figure 10:
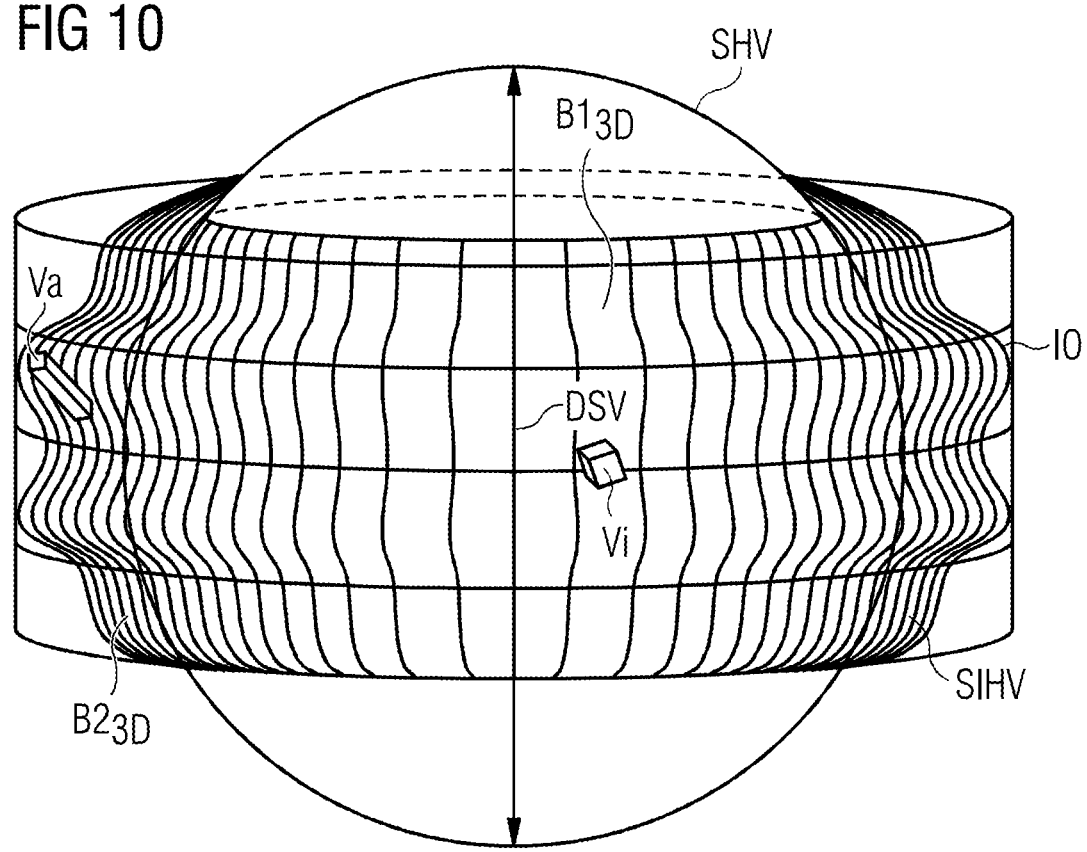
FIG. 10 is a schematic diagram of a spatial volume region that can be acquired by means of the inventive method for generating volume image data, which region extends continuously inside a homogeneity volume and outside a homogeneity volume of the $B_0$ magnetic field.

As shown in FIG. 10 in comparison with FIG. 9, the behavior is similar if the image points have been reconstructed as volume image data. The image points, which have been reconstructed inside the first recording region $B1_{3D}$ in the homogeneity volume SHV, are isotropic voxels Vi. Due to the magnetic field $B_0$ with different extents, the image point shown by way of example here in the second recording region $B2_{3D}$ outside the homogeneity volume SHV is an anisotropic voxel Va. A Fast Fourier Transform is not possible in the second recording region $B2_{3D}$ here either.

The method steps IIa, IIb shown in FIG. 6 for the reconstruction of the image data BD1, BD2 can take place independently of each other time-wise, in other words one after the other as desired or simultaneously or also slightly staggered.

In a following method step III for generating a final homogeneous magnetic resonance scan, the first image data BD1 reconstructed in method step IIa and the second image data BD2 reconstructed in method step IIb are joined together to form combination image data BDK.

Figure 11:
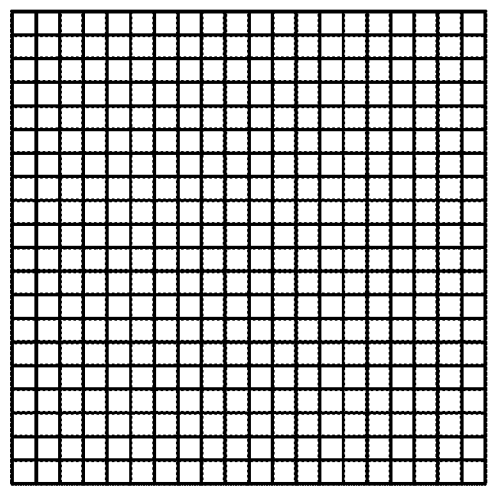
FIG. 11 is a schematic diagram of an isotropic grid.
Figure 12:
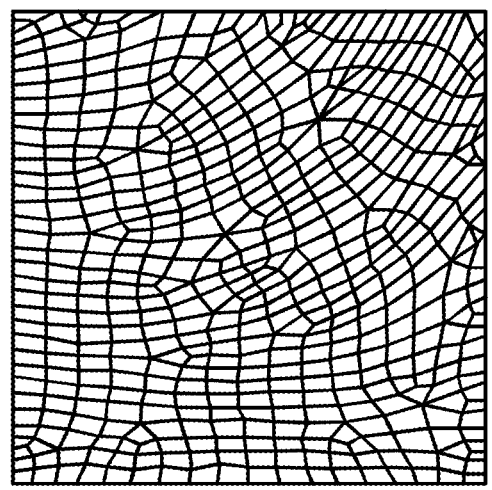
FIG. 12 is a schematic diagram of an anisotropic grid.

FIG. 11 shows in this regard an isotropic grid 25 on which the isotropic pixels Pi, or voxels Vi from FIG. 9 or FIG. 10 can be displayed. In contrast thereto, FIG. 12 shows an example of an anisotropic grid 26. In order obtain a homogeneous image overall, the first recording region $B1_{2D}$, $B1_{3D}$ and the second recording region $B2_{2D}$, $B2_{3D}$ are merged with the aid of what is known as a regridding method on an isotropic grid. Specifically, the image data of the second recording region $B2_{2D}$, $B2_{3D}$ can be adapted here with the aid of the regridding method to the image data of the first recording region $B1_{2D}$, $B1_{3D}$, in other words the isotropic grid that already exists for this. This is achieved, for example, by execution of a correction of the magnetic field non-linearity and an adjustment of the pixel or voxel size and the spatial encoding.

In conclusion, it is noted once again that the methods described in detail above and the illustrated magnetic resonance tomography system are only exemplary embodiments, which can be modified by those skilled in the art in a wide variety of ways without departing from the scope of the invention. Furthermore, use of the indefinite article "a" or "an" does not preclude the relevant features from also being present several times. Similarly, the terms "unit" and "module" do not preclude the relevant components from comprising a plurality of cooperating sub-components which, optionally, can be spatially distributed as well.

The invention claimed is:

1. A method for generating magnetic resonance (MR) recordings of an examination subject situated in an MR data acquisition scanner of an MR tomography apparatus, said method comprising:
    operating the MR data acquisition scanner to acquire first MR raw data from the subject, in a first recording region that is inside a homogeneity volume of the scanner, and to acquire second MR raw data from the subject, in a second recording region that is outside of said homogeneity volume;
    in a computer, reconstructing first image data based on said first MR raw data, and reconstructing second image data based on said second MR raw data; and
    in said computer, combining said first image data and said second image data so as to form combination image data, said combination image data covering a region that extends in said first recording region and in said second recording region.

2. A method as claimed in claim 1 comprising acquiring said first MR data in k-space, and reconstructing said first image data by executing a Fourier transformation of said first MR raw data in k-space, and reconstructing said second image data by executing a signal model-based image reconstruction method based on said second MR raw data.

3. A method as claimed in claim 2 comprising reconstructing said first image data so as to depict image points of said first image data on a first isotropic grid, and after reconstructing said second image data, regridding said second image data so as to depict image points of said second image data on an isotropic grid that is adjusted to the isotropic grid of said image points of said first image data.

4. A method as claimed in claim 1 wherein said homogeneity volume is produced by a basic magnetic field generated by a basic field magnet in said MR data acquisition scanner, and comprising acquiring said second MR data on at least one of iso-frequency contours of said basic magnetic field and iso-frequency surfaces of said basic magnetic field.

5. A method as claimed in claim 1 comprising acquiring at least one of said first MR raw data and second MR raw data as slice raw data.

6. A method as claimed in claim 1 comprising acquiring at least one of said first MR raw data and second MR raw data as volume raw data.

7. A method as claimed in claim 1 comprising acquiring at least one of said first MR raw data and said second MR raw data by executing an MR data acquisition sequence in said MR data acquisition scanner, selected from the group consisting of an MR data acquisition sequence that produces a gradient echo signal and an MR data acquisition sequence that produces a spin echo signal.

8. A method as claimed in claim 1 comprising acquiring said second MR raw data by operating said MR data acquisition scanner so as to radiate a slice-selective radio-frequency (RF) excitation pulse, and activating a bipolar gradient pulse coordinated with said slice-selective RF excitation pulse.

9. A method as claimed in claim 1 comprising acquiring said second MR raw data by operating said MR data acquisition scanner so as to radiate a non-slice-selective radio-frequency (RF) excitation pulse, and to activate a phase-encoding gradient pulse after radiating said non-slice-selective RF excitation pulse.

10. A method as claimed in claim 1 comprising producing said homogeneity volume in said scanner by generating a basic magnetic field in said scanner with a basic field magnet, and wherein acquiring said second MR raw data includes activating a gradient pulse that produces a non-linear gradient magnetic field, and wherein said method comprises, before acquiring said second MR raw data, determining, in said computer, a magnetic field distribution of at least one of said basic magnetic field and said non-linear gradient field, at least in said second recording region.

11. A control computer for controlling a magnetic resonance (MR) apparatus, having an MR data acquisition scanner, said control computer comprising:
an acquisition processor configured to operate the MR data acquisition scanner to acquire first MR raw data from the subject, in a first recording region that is inside a homogeneity volume of the scanner, and to acquire second MR raw data from the subject, in a second recording region that is outside of said homogeneity volume;
a reconstruction processor configured to reconstruct first image data based on said first MR raw data, and to reconstruct second image data based on said second MR raw data; and
a combination processor configured to combine said first image data and said second image data so as to form combination image data, said combination image data covering a region that extends in said first recording region and in said second recording region.

12. A magnetic resonance (MR) apparatus comprising:
an MR data acquisition scanner;
a computer configured to operate the MR data acquisition scanner to acquire first MR raw data from the subject, in a first recording region that is inside a homogeneity volume of the scanner, and to acquire second MR raw data from the subject, in a second recording region that is outside of said homogeneity volume;
said computer being configured to reconstruct first image data based on said first MR raw data, and reconstructing second image data based on said second MR raw data; and
said computer being configured to combine said first image data and said second image data so as to form combination image data, said combination image data covering a region that extends in said first recording region and in said second recording region.

13. A non-transitory, computer-readable data storage medium encoded with programming instructions, said storage medium being loaded into a computer of a magnetic resonance (MR) apparatus comprising an MR data acquisition scanner, said programming instructions causing said computer to:
operate the MR data acquisition scanner to acquire first MR raw data from the subject, in a first recording region that is inside a homogeneity volume of the scanner, and to acquire second MR raw data from the subject, in a second recording region that is outside of said homogeneity volume;
reconstruct first image data based on said first MR raw data, and reconstructing second image data based on said second MR raw data; and
combine said first image data and said second image data so as to form combination image data, said combination image data covering a region that extends in said first recording region and in said second recording region.

* * * * *